(12) United States Patent
Ger et al.

(10) Patent No.: US 7,969,157 B2
(45) Date of Patent: Jun. 28, 2011

(54) FAULT DETECTION CIRCUIT

(75) Inventors: Chih-Chan Ger, Jhongli (TW);
Chi-Chang Lu, Hsinchu (TW);
Chia-Kun Chen, Jhongli (TW)

(73) Assignees: Ampower Technology Co., Ltd.,
Jhongli, Taoyuan County (TW); Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 206 days.

(21) Appl. No.: 12/477,129

(22) Filed: Jun. 3, 2009

(65) Prior Publication Data
US 2010/0253365 A1 Oct. 7, 2010

(30) Foreign Application Priority Data
Apr. 3, 2009 (CN) .......................... 2009 1 0106523

(51) Int. Cl.
*G01R 31/28* (2006.01)
*G01R 31/00* (2006.01)
*H01H 31/02* (2006.01)

(52) U.S. Cl. ........................ 324/529; 324/555; 702/58

(58) Field of Classification Search .................. 324/529, 324/528, 527, 512, 555, 500, 509, 531; 361/42, 361/88, 93.1; 702/58, 59, 185
See application file for complete search history.

(56) References Cited

U.S. PATENT DOCUMENTS

| | | | | |
|---|---|---|---|---|
| 4,833,414 A * | 5/1989 | Heller | ........................ | 324/522 |
| 5,237,208 A * | 8/1993 | Tominaga et al. | .............. | 307/66 |
| 6,198,401 B1 * | 3/2001 | Newton et al. | ................ | 340/635 |
| 7,250,731 B2 * | 7/2007 | Jin | ................................ | 315/282 |
| 7,362,103 B2 * | 4/2008 | Ger et al. | ....................... | 324/414 |
| 7,830,099 B2 * | 11/2010 | Ger et al. | ....................... | 315/291 |
| 2004/0125523 A1 * | 7/2004 | Edwards et al. | ................ | 361/88 |
| 2007/0115001 A1 * | 5/2007 | Ger et al. | ....................... | 324/414 |
| 2009/0009920 A1 * | 1/2009 | Yamada | ....................... | 361/93.1 |

* cited by examiner

*Primary Examiner* — Hoai-An D Nguyen
(74) *Attorney, Agent, or Firm* — Raymond J. Chew (57) ABSTRACT

A fault detection circuit connects to and determines the occurrence of failure in an inverter circuit. The inverter circuit comprises three outputs to connect three groups of lamps respectively, and the fault detection circuit comprises a magnetic unit and a signal detection unit. The magnetic unit comprises first, second and third flux generating windings electrically connected to the three outputs of the inverter circuit, and a flux detection winding. If no fault occurs on the outputs of the inverter circuit, total flux generated by the flux generating windings is cancelled out. As long as any fault occurs on the outputs of the inverter circuit, flux generated by the flux generating windings cannot be canceled out, and the flux detection winding is electromagnetically coupled accordingly and driven by the generated flux to output a coupling signal, based on which the signal detection unit generates an alert signal accordingly.

8 Claims, 9 Drawing Sheets

(Related Art)

FIG. 9
(Related Art)

FAULT DETECTION CIRCUIT

BACKGROUND

1. Technical Field

The present disclosure relates to detection circuits, and especially to a fault detection circuit.

2. Description of Related Art

Figure 8:
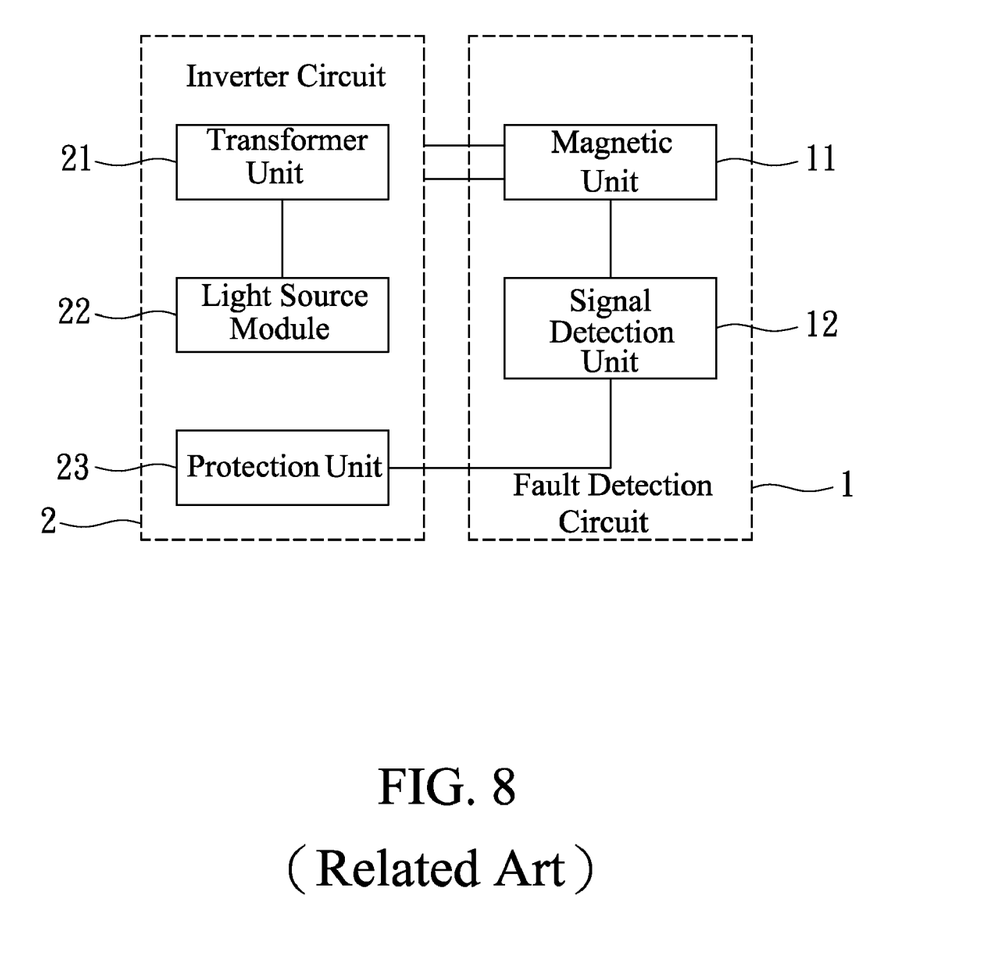
FIG. 8 is a block diagram of a commonly used fault detection circuit, showing connections between the fault detection circuit and an inverter circuit.
Figure 9:
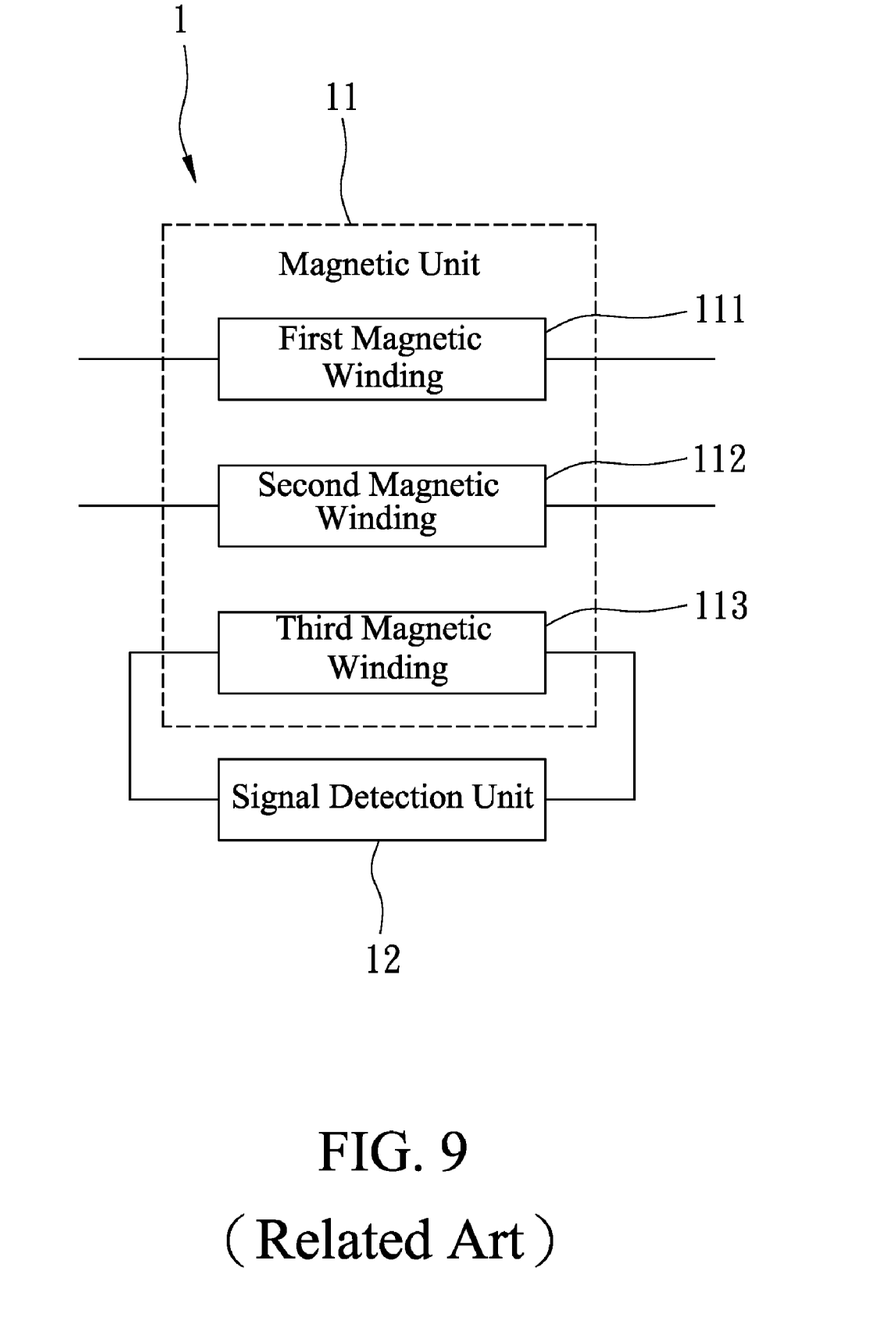
FIG. 9 is a detailed circuit diagram of the fault detection circuit of FIG. 8.

Referring to FIG. 8 and FIG. 9, a commonly used fault detection circuit 1 is connected to an inverter circuit 2 with a plurality of outputs, to detect whether one or more of the outputs of the inverter circuit 2 are faulty. The outputs of the inverter circuit 2 are divided into two groups. The inverter circuit 2 drives a light source module 22, and comprises a transformer unit 21 and a protection unit 23. The fault detection circuit 1 comprises a magnetic unit 11 and a signal detection unit 12.

The magnetic unit 11, connected to the inverter circuit 2, determines whether one or more of the outputs of the inverter circuit 2 are faulty, and comprises a first magnetic winding 111, a second magnetic winding 112 and a third magnetic winding 113.

The first magnetic winding 111 is connected to one group output of the inverter circuit 2, and the second magnetic winding 112 is connected to another group output of the inverter circuit 2. In addition, wrapping directions of the first magnetic winding 111 and the second wrapping winding 112 are opposite. Thus, when one or more of the outputs of the inverter circuit 2 are faulty, total flux generated by the first and second magnetic windings 111, 112 cannot be canceled out. Accordingly, the third magnetic winding 113 generates a detection signal. The signal detection unit 12 generates an abnormal signal according to the detection signal, and outputs the abnormal signal to the protection unit 23. The protection unit 23 protects the inverter circuit 2.

However, when the number of abnormal lamps of the light source module 22 corresponding to the two groups of output of the inverter circuit 2 are the same, flux generated by the first and second magnetic windings 111, 112 is the same and can also be canceled out. In this instance, the third magnetic winding 113 detects no flux and does not generate the abnormal signal, thus, the abnormal of the inverter circuit 2 is not detected.

DETAILED DESCRIPTION

Similar components in embodiments of the present disclosure described have the same labels.

Figure 1:
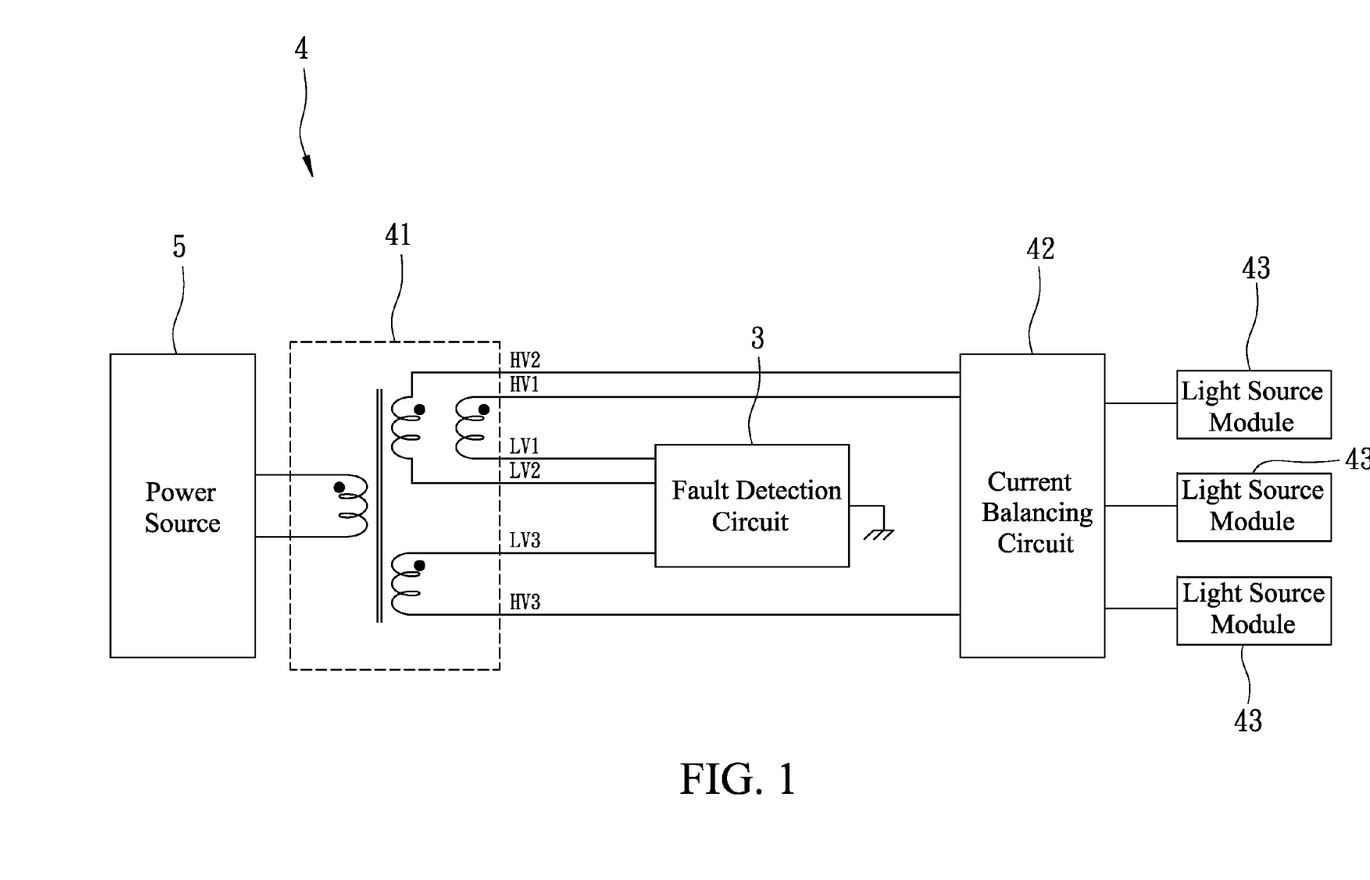
FIG. 1 is a block diagram of a first embodiment of a fault detection circuit of the present disclosure, showing connections between the fault detection circuit and a transformer unit, a power source, a current balancing circuit and a light source module.
Figure 2:
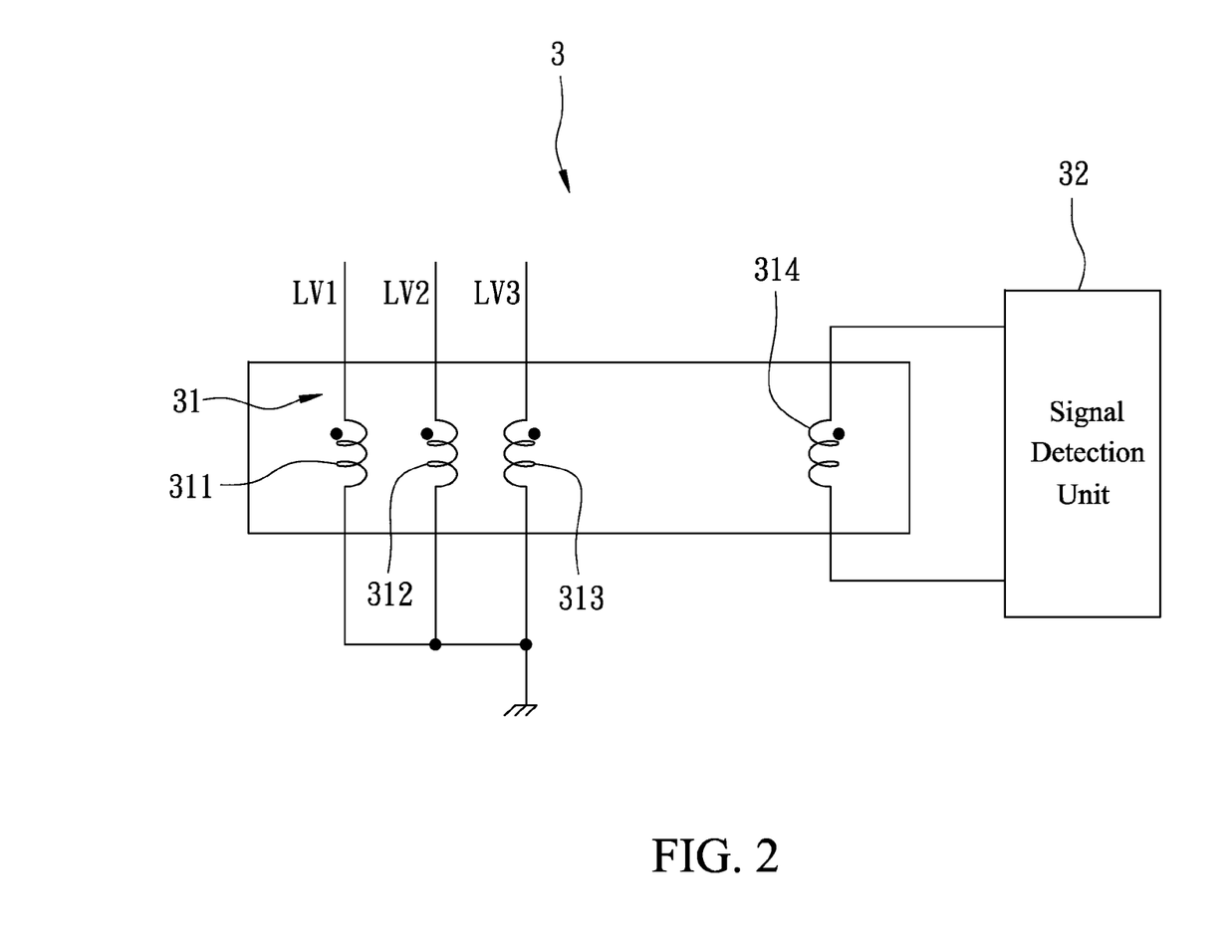
FIG. 2 is a detailed circuit diagram of one embodiment of the fault detection circuit of FIG. 1.

FIG. 1 is a schematic diagram of a first embodiment of a fault detection circuit 3 of the present disclosure, and FIG. 2 a detailed circuit diagram of one embodiment of the fault detection circuit 3 of FIG. 1. The fault detection circuit 3 is connected to an inverter circuit 4 with a plurality of outputs, to detect whether any of the plurality of outputs of the inverter circuit 4 are faulty. In one embodiment, the outputs of the inverter circuit 4 are divided into three groups (described in detail below) to drive a light source module 43 respectively. The fault detection circuit 3 comprises a magnetic unit 31 and a signal detection unit 32. In one embodiment, the signal detection unit 32 can be a commonly used protection circuit, to protect the inverter circuit 4.

In one embodiment, the inverter circuit 4 receives electrical signals output from a power source 5 and then converts the electrical signals to alternating current (AC) signals to drive three light source modules 43, which comprises a transformer unit 41 and a current balancing circuit 42. In one embodiment, the transformer circuit 41 comprises a primary winding and three secondary windings. The three secondary windings are corresponding to the three outputs of the inverter circuit 4. Each of the secondary windings of the transformer circuit 41 has a high voltage terminal (HV1 or HV2 or HV3) and a low voltage terminal (LV1 or LV2 or LV3) respectively. The high voltage terminals HV1, HV2, HV3 are jointly connected to the current balancing current circuit 42, and the low voltage terminals LV1, LV2, LV3 are jointly connected to the fault detection circuit 3. Voltage phases of the high voltage terminals HV1, HV2 are the same, different in voltage phase from the high voltage terminal HV3. The current balancing circuit 42 balances current flowing through the light source modules 43. In one embodiment, each light source module 43 comprises one or more lamps. The number of the light source module 43 can be three or more, which is not limited.

The magnetic unit 31 comprises a first magnetic winding 311, a second magnetic winding 312, a third magnetic winding 313, and a magnetic detection winding 314. The first, second and third magnetic windings 311, 312, 313 are connected to the low voltage terminals LV1, LV2, LV3, respectively. One end of each magnetic winding is defined as an input, and the other end thereof is defined as an output. Inputs of the first, second, and third magnetic windings 311, 312, 313 are connected to the low voltage terminals LV1, LV2, LV3 respectively, and the outputs thereof are connected to ground.

Alternatively, voltage phases of the high voltage terminals HV1, HV2, HV3 or low voltage terminals LV1, LV2, LV3 can be the same. In this instance, wrapping direction, and input and output direction of the first, second, and third magnetic windings 311, 312, 313 of the fault detection circuit 3 need to be arranged to cancel out total flux generated by the fault detection circuit 3, when the high voltage terminals HV1, HV2, HV3 and the low voltage terminals LV1, LV2, LV3 are normal.

When the outputs of the inverter circuit 4 are normal, the total flux generated by the first, second, and third magnetic windings 311, 312, 313 can be cancelled out. Thus, a formula N1*I1+N2*I2=N3*I3 can be expressed, wherein N1, N2, and N3 are turn numbers of the first, second, and third magnetic windings 311, 312, 313, and I1, I2, I3 are total current flowing through the first, second, and third magnetic windings 311, 312, 313. Because the current flowing through each lamp is substantially the same, the formula can be changed to N1*L1+N2*L2=N3*L3, wherein L1, L2, L3 are the number of lamps corresponding to the first, second, and third magnetic windings 311, 312, 313. In detail, the turn number of the first magnetic winding 311 multiplies the number of lamps corresponding to the first magnetic winding 311, which is defined as a first flux. The turn number of the second magnetic winding 312 multiplies by the number of lamps corresponding to the second magnetic winding 312, which is defined as a second flux. The turn number of the third magnetic winding 313 multiplies by the number of lamps corresponding to the third magnetic winding 313, which is defined as a third flux. In one embodiment, the first flux added to the second flux is equal to the third flux. When one or more of the outputs of the inverter circuit 4 are faulty, the total flux generated by the first, second, and third magnetic windings 311, 312, 313 cannot be canceled out. Thus, the formula is not satisfied.

For example, if the turn numbers of the first, second, and third magnetic winding 311 are 11, 5, 6 respectively, and the numbers of the lamp corresponding to the first, second, and third magnetic winding 311, 312, 313 are 1, 5, 6 respectively, a formula 11*1+5*5=6*6 is formed. However, when a lamp corresponding to the first magnetic winding 311 and third magnetic winding 313 are faulty, a formula 11*0+5*5≠6*5 can be applied. Thus, the total flux generated by the first, second, and third magnetic windings 311, 312, 313 cannot be canceled out.

When one or more of the outputs of the inverter circuit 4 are faulty, the magnetic detection winding 314 senses the total flux generated by the first, second, and third magnetic windings 311, 312, 313, and generates a detection signal. The signal detecting unit 32 accordingly generates an abnormal signal according to the detection signal.

Only total flux generated by the first, second, and third magnetic windings 311, 312, 313 is lower than a predetermined threshold, signal detection unit 32 generates no abnormal signal and the flux can be canceled out. If the total flux generated by the first, second, and third magnetic windings 311, 312, 313 exceeds the predetermined threshold, the magnetic detection winding 314 also generates the detection signal accordingly, and then the signal detection unit 32 generates the abnormal signal according to the detection signal. In the other words, although the outputs of the inverter circuit 4 are normal, the total flux generated by the first, second, and third magnetic windings 311, 312, 313 also cannot be canceled out.

Figure 3:
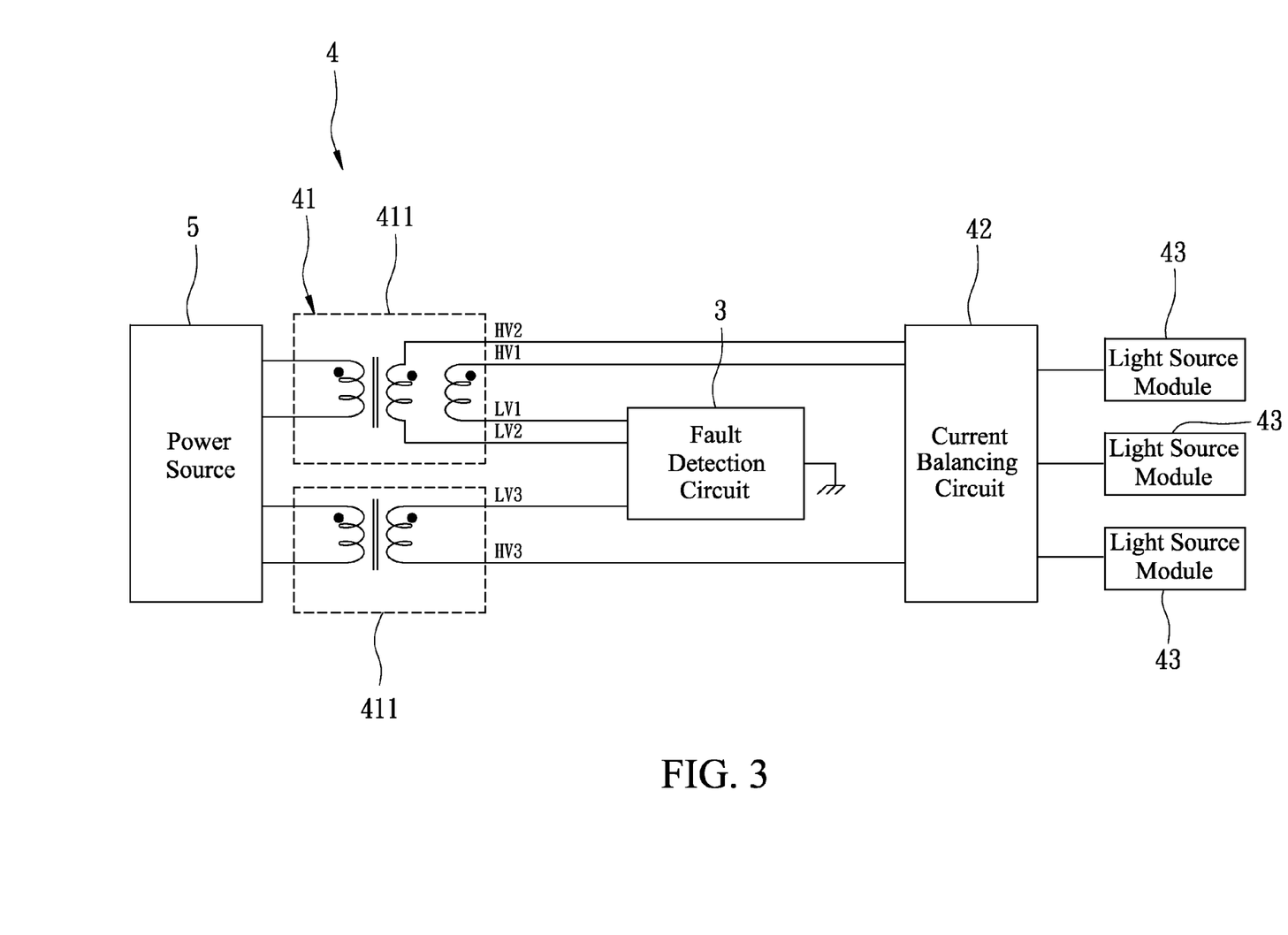
FIG. 3 is another block diagram of one embodiment of the fault detection circuit of FIG. 1.

Referring to FIG. 3, the transformer unit 41 comprises two individual transformers 411 having the same effectiveness.

In one embodiment, voltage phase of the high voltage terminal HV1 is the same as that of the high voltage terminal HV2, which is different from that of the high voltage terminal HV3. Similarly, voltage phase of the low voltage terminal LV1 is the same as that of the low voltage terminal LV2, which is different from that of the low voltage terminal LV3. Alternatively, voltage phases of the high voltage terminals HV1, HV2 can be the same as that of the high voltage terminal HV3, and voltage phases of the low voltage terminal LV1, LV2 can be the same as that of the low voltage terminal LV3, only needing to change polarities of the first, second, and third magnetic windings 311, 312, 313, but not limited thereto.

Figure 4:
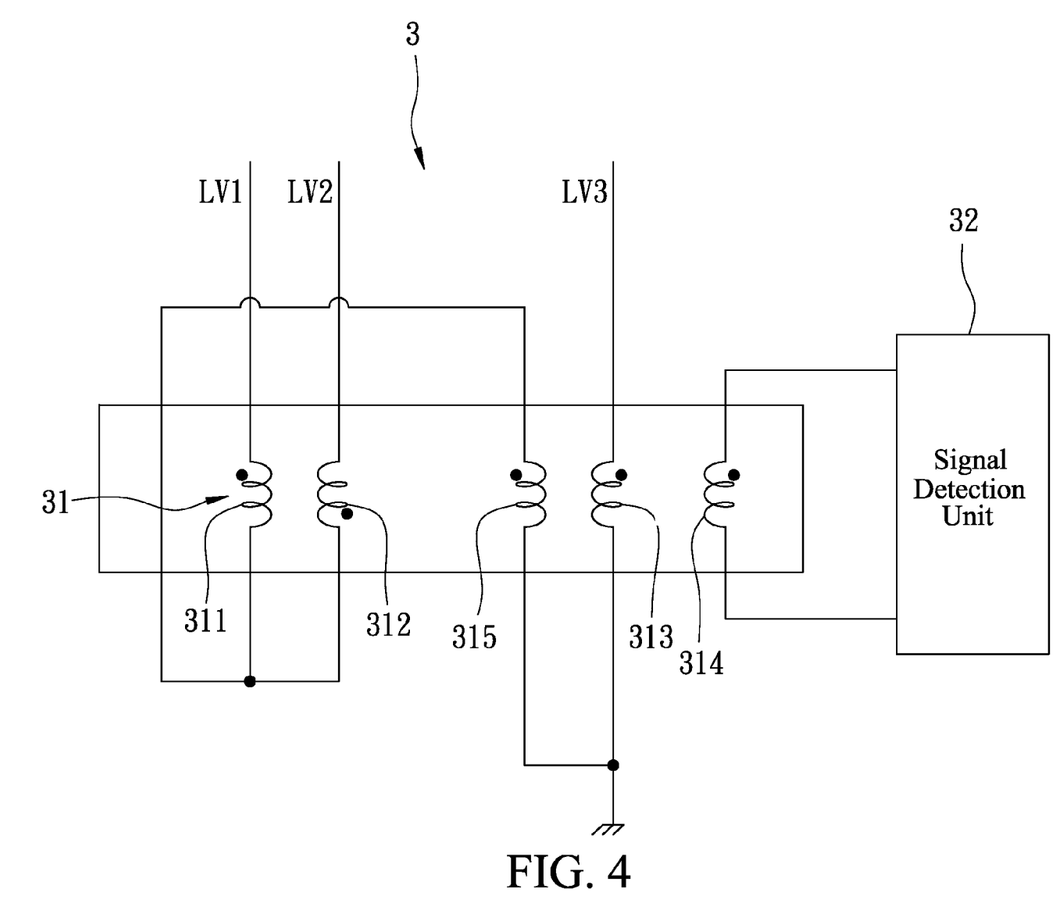
FIG. 4 is another detailed circuit diagram of one embodiment of the fault detection circuit of FIG. 1.

FIG. 4 is another detailed circuit diagram of one embodiment of the fault detection circuit 3, differing from the fault detection circuit 3 of FIG. 2 only in that the magnetic unit 31 of FIG. 4 comprises a fourth magnetic winding 315.

Similarly, each of the magnetic windings 311, 312, 313, 314 has an input and an output. The inputs of the first, second magnetic winding 311, 312 are connected to the low voltage terminals LV1, LV2 respectively, and the outputs thereof are connected to the input of the fourth magnetic winding 315. The input of the third magnetic winding 313 is connected to the low voltage terminal LV3, and the outputs of the third magnetic winding 313 and the fourth magnetic winding 315 are connected to ground.

Therefore, when the outputs of the inverter circuit 4 are normal, the total flux generated by the magnetic windings 311, 312, 313, 314 can be canceled out. In one embodiment, the turn number of the first magnetic winding 311 multiplied by the number of lamps corresponding to the first magnetic winding 311, equals the turn number of the second magnetic winding 312 multiplied by the number of lamps corresponding to the second magnetic winding 312. Similarly, the turn number of the third magnetic winding 313 multiplied by the number of lamps corresponding to the third magnetic winding 313, equals the turn number of the fourth magnetic winding 315 multiplied by the number of lamps corresponding to the fourth magnetic winding 315. Thus, two formulae can be applied. When one or more outputs of the inverter circuit 4 are faulty, the total flux generated by the magnetic windings 311, 312, 313, 315 cannot be canceled. In this instance, at least one of the formulae is not satisfied.

For example, if the turn numbers of the first, second, third, and fourth magnetic windings 311, 312, 313, 315 are 5, 5, 2, 2 respectively, and the numbers of the lamps corresponding to the first, second, and third and fourth magnetic windings 311, 312, 313, 315 are 3, 3, 6, 6 respectively, the two formulae: 5*3=5*3 and 2*6=2*6 can be applied. Thus, the outputs of the inverter circuit 4 are normal. However, when one lamp corresponding to both of the first magnetic winding 311 and the third magnetic winding 313 are faulty, the formulae become 5*2≠5*3 and 2*5=2*5. Therefore, one of the formulae is not satisfied, and flux generated by the first, second, and third and fourth magnetic windings 311, 312, 313, 315 cannot be canceled.

Figure 5:
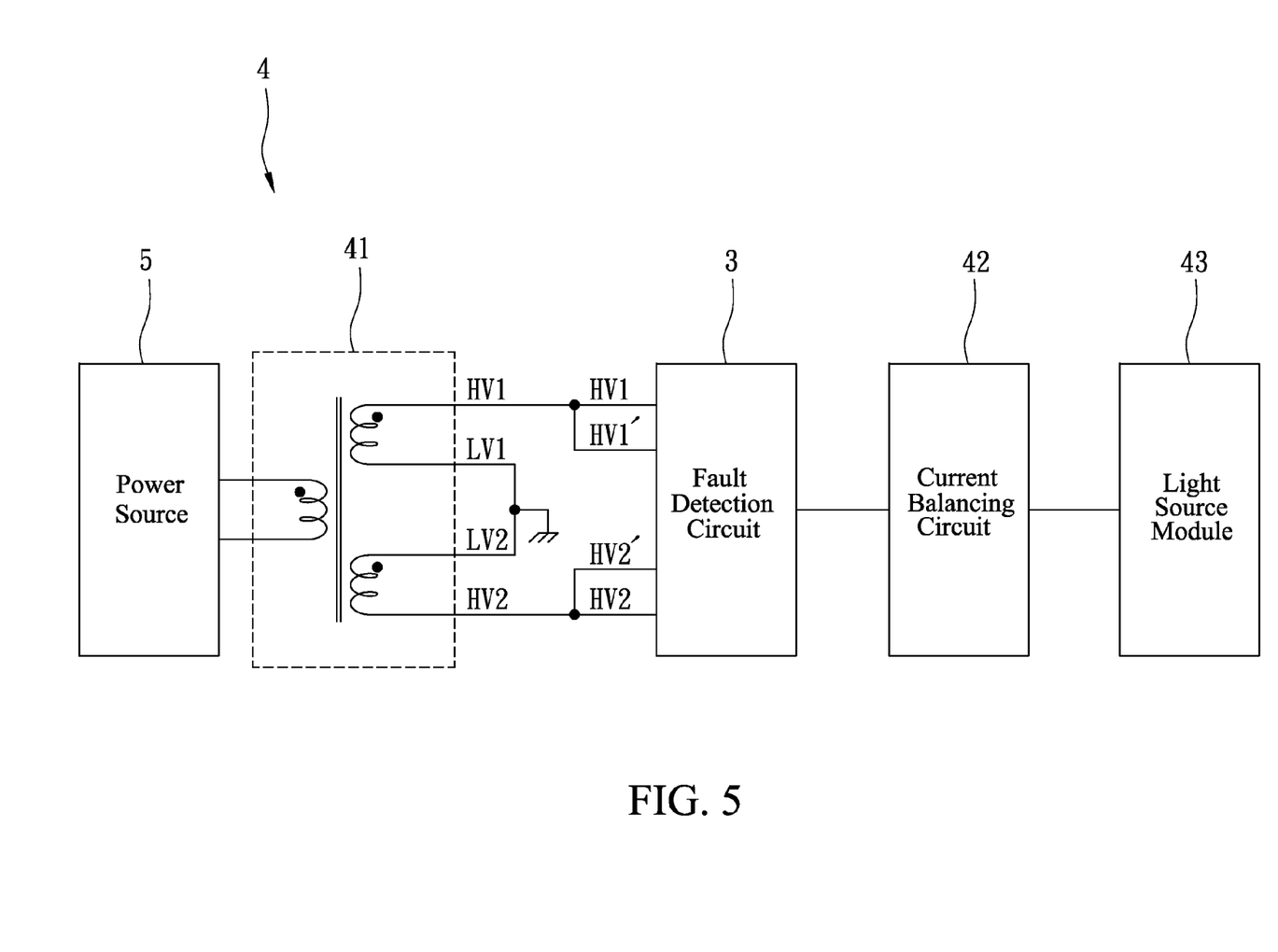
FIG. 5 is a block diagram of a second embodiment of a fault detection circuit of the present disclosure, showing connections between the fault detection circuit and a transformer unit, a power source, a current balancing circuit and a light source module.

When one or more of the outputs of the inverter circuit 4 are faulty, the magnetic detection winding 314 senses the flux generated by the first, second, third, and fourth magnetic windings 311, 312, 313, 315, and generates a detection signal. The signal detecting unit 32 generates an abnormal signal according to the detection signal, accordingly FIG. 5 is a schematic diagram of a second embodiment of a fault detection circuit 3 of the present disclosure, and FIG. 6 a detailed circuit diagram of one embodiment of the fault detection circuit 3. The fault detection circuit 3 is connected to an inverter circuit 4 with a plurality of outputs, detecting whether one or more of the plurality of outputs of the inverter circuit 4 are faulty. In one embodiment, the outputs of the inverter circuit 4 are divided into two groups. The fault detection circuit 3 comprises a first magnetic winding 33, a second magnetic winding 34, a first magnetic sensing winding 35, a third magnetic winding 36, a fourth magnetic winding 37, a second magnetic sensing winding 38 and a signal detection unit 32. In one embodiment, the signal detection unit 32 can be a commonly used protection circuit, to protect inverter circuit 4.

Figure 6:
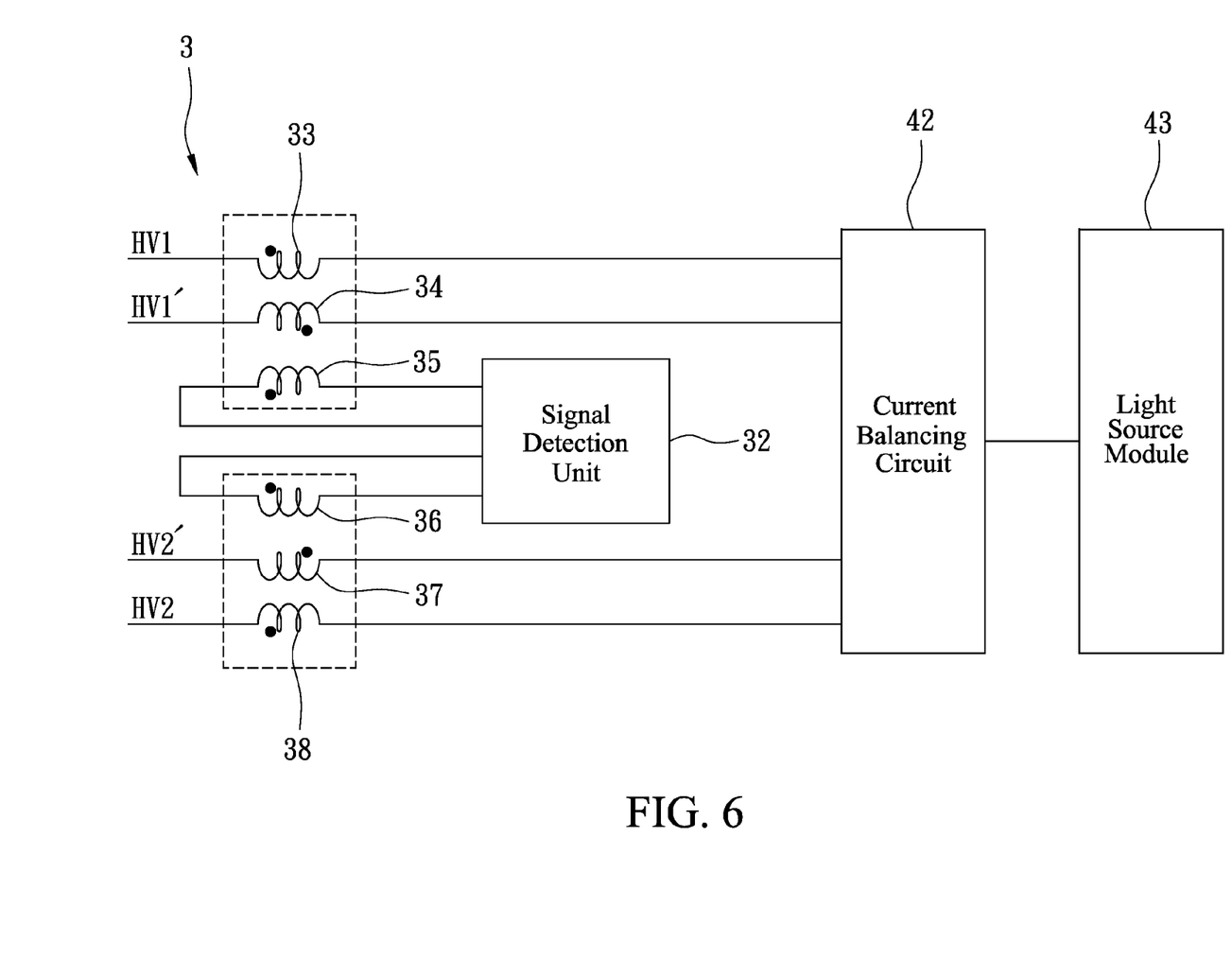
FIG. 6 is a detailed circuit diagram of one embodiment of the fault detection circuit of FIG. 5.

In one embodiment, the inverter circuit 4 receives electrical signals output from a power source 5 and then converts the electrical signals to AC signals to drive a light source module 43, which comprises a transformer unit 41 and a current balancing circuit 42. In one embodiment, the transformer unit 41 comprises a primary winding and two secondary windings. The two secondary windings are corresponding to the two outputs groups of the inverter circuit 4. Each of the secondary windings of the transformer circuit 41 has a high voltage terminal (HV1 or HV2) and a voltage terminal (LV1 or LV2) respectively. The low voltage terminals LV1 and LV2 are connected to ground. In one embodiment, the two high voltage terminals HV1, HV2 are divided into four high voltage terminals HV1, HV1', HV2, HV2', connected to a lamp respectively. The current balancing circuit 42 balances current flowing through the light source module 43. In one embodiment, the light source module 43 comprises at least four lamps or more.

When the outputs of the inverter circuit 4 are normal, the total flux generated by the first, second, third, and fourth magnetic windings 33, 34, 36, 37 can be canceled out. In one embodiment, the turn number of the first magnetic winding 33 multiplied by the number of lamps corresponding to the first magnetic winding 33, equals the turn number of the second magnetic winding 34 multiplied by the number of lamps corresponding to the second magnetic winding 34. Similarly, the turn number of the third magnetic winding 36 multiplied by the number of lamps corresponding to the third magnetic winding 36, equals the turn number of the fourth magnetic winding 37 multiplied by the number of lamps corresponding to the fourth magnetic winding 37. Thus, two formulae can be applied. When one or more of the outputs of the inverter circuit 4 are faulty, the total flux generated by the magnetic windings 33, 34, 36, 37 cannot be canceled. In this instance, at least one of the formulae is not satisfied.

For example, if the turn numbers of the first, second, and third and fourth magnetic windings 33, 34, 36, 37 are respectively 5, 5, 5, 5, and the numbers of the lamps corresponding to the first, second, third, and fourth magnetic windings 33, 34, 36, 37 are 3, 3, 3, 3 respectively, the two formulae: 5*3=5*3 and 5*3=5*3 can be applied. Thus, the outputs of the inverter circuit 4 are not faulty. However, when one lamp corresponding to both of the first magnetic winding 33 and the third magnetic winding 36 are faulty, the formulae become 5*2≠5*3 and 5*2≠5*3. Therefore, both the formulae are not satisfied, and flux generated by the first, second, and third and fourth magnetic windings 33, 34, 36, 37 cannot be canceled out.

When one or more of the outputs of the inverter circuit 4 are faulty, the magnetic detection windings 35, 38 detect the flux generated by the first, second, third, and fourth magnetic windings 33, 34, 36, 37, and generates a detection signal respectively. The signal detecting unit 32 generates an abnormal signal according to the detection signals accordingly.

Figure 7:
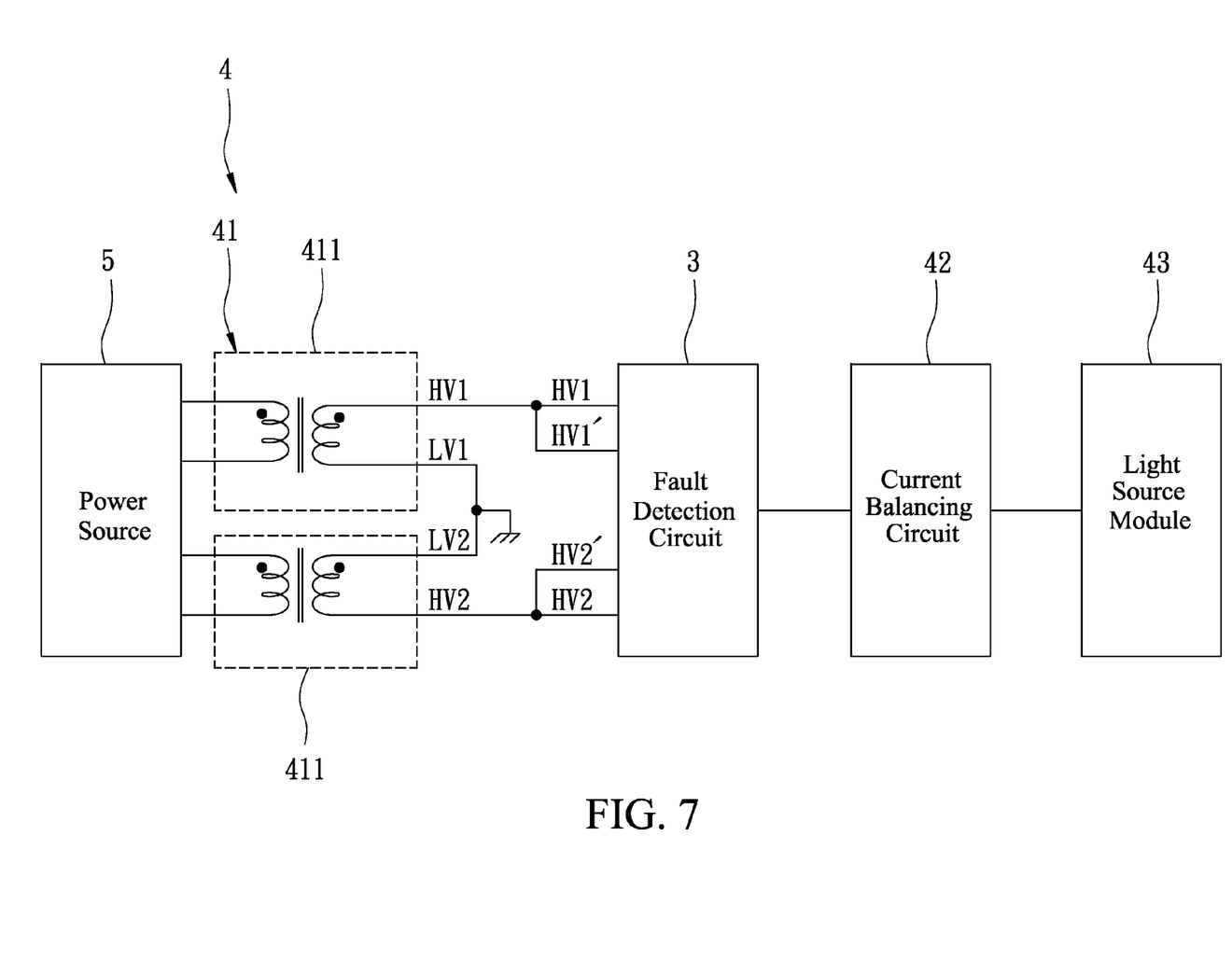
FIG. 7 is another block diagram of one embodiment of the fault detection circuit of FIG. 5.

Referring to FIG. 7, the transformer unit 41 comprises two individual transformers 411 having the same effectiveness.

When the number of abnormal lamps in the light source module 43 corresponding to the high voltage terminals is equal to that corresponding to the low voltage terminals, one or more formulae are applied to determine if one or more of the outputs of the inverter circuit 4 are faulty. Thus, the same number of abnormal lamps corresponding to the high voltage terminals and the low voltage terminals can be detected.

Although the features and elements of the present disclosure are described in various inventive embodiment in particular combinations, each feature or element can be configured alone or in various within the principles of the present disclosure to the full extent indicated by the broad general meaning of the terms in which the appended claims are expressed.

What is claimed is:

1. A fault detection circuit, connected to an inverter circuit with a plurality of outputs, to detect whether one or more of the outputs of the inverter circuit are faulty, wherein the outputs of the inverter circuit are divided into three groups connected to three light source modules respectively, and each light source module comprises at least one lamp, the fault detection circuit comprising:
   a magnetic unit, comprising a first magnetic winding, a second magnetic winding and a third magnetic winding corresponding to the three group outputs of the inverter circuit; wherein when the outputs of the inverter circuit are normal, total flux generated by the first, second, and third magnetic windings can be canceled out; when one or more of the outputs of the inverter circuit are faulty, the total flux generated by the first, second, and third magnetic windings cannot be canceled out;
   a magnetic detection winding arranged to detect the total flux generated by the first, second, and third magnetic windings and generate a detection signal; and
   a signal detection unit arranged to generate an abnormal signal according to the detection signal.

2. The fault detection circuit as claimed in claim 1, wherein when the outputs of the inverter circuit are normal, a turn number of the first magnetic winding multiplied by a number of lamps corresponding to the first magnetic winding is defined as a first flux, a turn number of the second magnetic winding multiplied by a number of lamps corresponding to the second magnetic winding is defined as a second flux, and a turn number of the third magnetic winding multiplied by a number of lamps corresponding to the third magnetic winding defined as a third flux; wherein the first flux added the second flux is equal to the third flux.

3. The fault detection circuit as claimed in claim 1, wherein each of the first, second, and third magnetic windings has an input and an output, wherein the inputs of the first, second, and third magnetic windings are connected to the three group outputs of the inverter circuit respectively, and the outputs thereof are connected to ground.

4. A fault detection circuit, connected to an inverter circuit with a plurality of outputs, to detect whether one or more of the outputs of the inverter circuit are faulty, wherein the outputs of the inverter circuit are divided into three groups connected to three light source modules respectively, and each light source module comprises at least one lamp, the fault detection circuit comprising:
   a magnetic unit, comprising a first magnetic winding, a second magnetic winding and a third magnetic winding corresponding connected to the three group outputs of the inverter circuit, and a fourth magnetic winding connected between the first, second magnetic windings and the third magnetic winding; wherein when the outputs of the inverter circuit are normal, total flux generated by the first, second, and third and fourth magnetic windings can be canceled out; when one or more of the outputs of the inverter circuit are faulty, the total flux generated by the magnetic windings cannot be canceled out;
   a magnetic detection winding, arranged to detect the total flux generated by the first, second, third, and fourth magnetic windings and generate a detection signal; and
   a signal detection unit arranged to generate an abnormal signal according to the detection signal.

5. The fault detection circuit as claimed in claim 4, wherein when the outputs of the inverter circuit are normal, a turn number of the first magnetic winding multiplied by a number of lamps corresponding to the first magnetic winding is equal to a turn number of the second magnetic winding multiplied by a number of lamps corresponding to the second magnetic winding, and a turn number of the third magnetic winding multiplied by a number of lamps corresponding to the third magnetic winding is equal to a turn number of the fourth magnetic winding multiplied by a number of lamps corresponding to the fourth magnetic winding.

6. The fault detection circuit as claimed in claim 4, wherein each of the first, second, third, and fourth magnetic windings has an input and an output, wherein the inputs of the first, second, and third magnetic windings are connected to the three group outputs of the inverter circuit respectively.

7. The fault detection circuit as claimed in claim 6, wherein the outputs of the first, second magnetic windings are connected to the input of the fourth magnetic winding, and the outputs of the third magnetic winding and the fourth magnetic winding are connected to ground.

8. A fault detection circuit, connected to an inverter circuit with a plurality of outputs, to determine whether one or more of the outputs of the inverter circuit are faulty, wherein the outputs of the inverter circuit are divided into four groups, the fault detection circuit comprising:

a first magnetic winding, connected to a first group output of the inverter circuit;

a second magnetic winding, connected to a second group output of the inverter circuit; wherein when the outputs of the inverter circuit are normal, total flux generated by the first, second magnetic windings cancels out; and when one or more of the outputs of the inverter circuit are faulty, the total flux generated by the first, second magnetic windings cannot be canceled out;

a first magnetic detection winding to detect the total flux generated by the first, second magnetic windings and generate a first detection signal accordingly when one or more of the outputs of the inverter circuit are faulty;

a third magnetic winding, connected to a third group output of the inverter circuit;

a fourth magnetic winding, connected to a fourth group output of the inverter circuit;

wherein when the outputs of the inverter circuit are normal, the total flux generated by the third and fourth magnetic windings is cancelled out; and when one or more of the outputs of the inverter circuit are faulty, flux generated by the third and fourth magnetic windings cannot be canceled out;

a second magnetic detection winding to detect the flux generated by the third and fourth magnetic windings and generate a second detection signal accordingly when the outputs of the inverter circuit are faulty; and a signal detection unit to generate an abnormal signal according to the first and second detection signals.

* * * * *